United States Patent
Guo et al.

(10) Patent No.: US 11,450,467 B2
(45) Date of Patent: Sep. 20, 2022

(54) MAGNETORESISTIVE ELEMENT HAVING A GIANT INTERFACIAL PERPENDICULAR MAGNETIC ANISOTROPY AND METHOD OF MAKING THE SAME

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 198 days.

(21) Appl. No.: 17/105,381

(22) Filed: Nov. 25, 2020

(65) Prior Publication Data

US 2022/0165470 A1 May 26, 2022

(51) Int. Cl.
*H01L 43/10* (2006.01)
*H01F 10/32* (2006.01)
*H01L 43/12* (2006.01)
*H01F 41/30* (2006.01)

(52) U.S. Cl.
CPC ....... *H01F 10/3286* (2013.01); *H01F 10/329* (2013.01); *H01F 10/3254* (2013.01); *H01F 10/3268* (2013.01); *H01F 41/302* (2013.01); *H01L 43/10* (2013.01); *H01L 43/12* (2013.01)

(58) Field of Classification Search
CPC ............. H01F 10/3286; H01F 10/3254; H01F 10/3268; H01F 10/329; H01F 41/302; H01L 43/10; H01L 43/12
USPC ........................................................ 257/421
See application file for complete search history.

(56) References Cited

U.S. PATENT DOCUMENTS

| | | | | |
|---|---|---|---|---|
| 10,193,061 | B2* | 1/2019 | Shiokawa | H01F 10/329 |
| 11,377,749 | B1* | 7/2022 | Gong | C25D 3/562 |
| 2014/0084398 | A1* | 3/2014 | Oguz | H01L 43/10 |
| | | | | 257/E29.323 |
| 2019/0221712 | A1* | 7/2019 | Matias | H01L 31/036 |
| 2019/0339219 | A1* | 11/2019 | Vernieres | G01N 33/0037 |
| 2020/0313076 | A1* | 10/2020 | Oguz | G11C 11/161 |
| 2022/0068339 | A1* | 3/2022 | Dieny | G01R 33/093 |
| 2022/0165470 | A1* | 5/2022 | Guo | H01F 10/3254 |

* cited by examiner

*Primary Examiner* — Jami Valentine Miller
*Assistant Examiner* — Jami V Miller

(57) ABSTRACT

A magnetoresistive element comprises a novel iPMA cap layer on a surface of a recording layer to induce a giant interfacial perpendicular magnetic anisotropy (G-iPMA) of the recording layer and a method of making the same. The recording layer comprises a first free layer immediately contacting to the tunnel barrier layer and having a body-centered cubic structure with a (100) texture, and a second free layer having a body-centered cubic structure with a (110) texture or a face-centered cubic structure with a (111) texture, and a crystal-breaking layer inserted between the first free layer and the second free layer.

20 Claims, 4 Drawing Sheets

MAGNETORESISTIVE ELEMENT HAVING A GIANT INTERFACIAL PERPENDICULAR MAGNETIC ANISOTROPY AND METHOD OF MAKING THE SAME

CROSS-REFERENCE TO RELATED APPLICATIONS

This application is related to U.S. patent application Ser. No. 17/096,554 entitled A MAGNETORESISTIVE ELEMENT HAVING A GIANT INTERFACIAL PERPENDICULAR MAGNETIC ANISOTROPY, filed Nov. 12, 2020, Ser. No. 17/098,362 entitled A METHOD OF MANUFACTURING A MAGNETORESISTIVE ELEMENT HAVING A GIANT INTERFACIAL PERPENDICULAR MAGNETIC ANISOTROPY, filed Nov. 14, 2020, and incorporated herein by reference.

BACKGROUND OF THE INVENTION

1. Field of the Invention

This invention relates to the field of magnetoresistive elements. More specifically, the invention comprises magnetic-random-access memory (MRAM) using magnetoresistive elements with recording layers having giant interfacial perpendicular magnetic anisotropies (G-iPMAs) as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer (also called a tunnel barrier layer), and a fixed reference layer that is located on the opposite side from the recording layer and maintains a predetermined magnetization direction. The change of resistance of the MTJ device is attributed to the difference in the tunneling probability of the spin polarized electrons through the tunnel barrier on the bias voltage across the device in accordance with the relative orientation of magnetizations of the ferromagnetic recording layer and the ferromagnetic reference layer. The ferromagnetic recording layer is also referred to as a free layer. MR ratio is defined as $(R_{AP}-R_P)/R_P$, where $R_{AP}$ and $R_P$ are resistances in anti-parallel and parallel magnetization at zero-magnetic field, respectively.

In order to change resistances of magnetoresistive elements, there has been suggested a write method using spin momentum transfers, i.e., spin torque transfer (STT) switching technique. According to this method, the magnetization direction of a recording layer is reversed by applying a spin-polarized current along a specific direction to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents. As another write method, SOT (spin-orbit torque) MRAM devices feature magnetization switching of the free layer immediately adjacent to a SOT layer, which is caused by the transverse spin polarized current across the free-layer-SOT-layer interface generated by injecting an in-plane electrical current in the adjacent SOT layer.

Further, as in a so-called perpendicular MTJ element, both two magnetization films of the recording layer and reference layer have easy axis of magnetization in a direction perpendicular to the film plane due to their strong perpendicular magnetic anisotropy (PMA) induced by both interface interaction and crystalline structure (shape anisotropies are not used), and accordingly, the device shape can be made smaller than that of an in-plane magnetization type. Also, variance in the easy axis of magnetization can be made smaller. Accordingly, by using a material having a large perpendicular magnetic anisotropy, both miniaturization and lower currents can be expected to be achieved while a thermal disturbance resistance is maintained.

There has been a known technique for achieving a high MR ratio and a high PMA in an MTJ element by forming an underneath MgO tunnel barrier layer and an MgO cap layer that sandwich a recording layer having a pair of amorphous CoFeB ferromagnetic layers, i.e., the first free layer (FL1) and the second free layer (FL2), and a Boron-absorbing layer positioned between them, and performing a thermal annealing process to accelerate crystallization of the amorphous ferromagnetic film to match interfacial grain structure to both MgO tunnel barrier layer and MgO cap layer. An MgO layer has a rocksalt crystalline structure in which each of Mg and O atoms forms a separate face-centered cubic (FCC) lattice, and Mg and O atoms together form a simple cubic lattice. The Boron-absorbing layer is typically made of Mo or W material. The recording layer crystallization starts from both the MgO tunnel barrier layer side and the MgO cap layer side to its center and forms a CoFe grain structure, which is mainly a body-centered cubic (bcc) crystalline structure, having a volume perpendicular magnetic anisotropy (vPMA), as Boron atoms migrate into the Boron-absorbing layer. In the same time, a typical rocksalt-MgO (100)/bcc-CoFe (100) texture occurs at the interface between a CoFeB layer and an MgO layer, which generates an interfacial perpendicular magnetic anisotropy (iPMA) and a high MR ratio. It forms an unique structure: rocksalt-MgO (100)/bcc-CoFe (100)/(W-boride or Mo-boride)/bcc-CoFe (100)/rocksalt-MgO (100) after a thermal annealing process. Accordingly, a coherent perpendicular magnetic tunneling junction structure is formed. By using this technique, both a high MR ratio and a high PMA can be readily achieved.

However, when an MTJ CD size is reduced to meet needs of very advanced and small technology nodes, the MgO tunnel barrier layer needs to be thinner or contains a reduced oxygen percentage to keep a reasonable MTJ resistance and the PMA of the recording layer needs to be higher to maintain a reasonable thermal stability factor ($E/k_BT$, where E is the product of the PMA and volume of the recording layer and also denotes the energy barrier between the two stable magnetization configurations of the recording layer, kB is the Boltzmann constant, and T is the absolute temperature 300K) which is normally required to be larger than 70 in the operation temperature range. Consequentially, it becomes more difficult to achieve both a high PMA of the recording layer and a high MR ratio in an MTJ element in order to maintain a good thermal stability and read/write performance.

A thick Boron-absorbing layer may help improve the volume perpendicular magnetic anisotropy (vPMA) of the recording layer. A further insertion of a thin Pt layer may greatly enhance the PMA of the recording layer. But, by doing so, the magnetic damping constant of the recording layer may increase dramatically due to a spin-pumping effect and its spin polarization may also decreases from the material diffusion of the thick Boron-absorbing layer during the heat treatment in the device manufacturing process, which may also cause a degradation of the MR ratio. In a spin-injection MRAM, the minimum write current is proportional to the damping constant and inversely proportional to its spin polarization. Since the sum of vPMA and iPMA leads to a total value of the PMA, which determines the thermal stability of the recording layer, another approach to increase the perpendicular magnetic anisotropy is to employ an in-situ plasma treatment or sputter-etching process on the top surface of the recording layer before the deposition of the MgO cap layer. However, this approach has a drawback: applying excess surface treatment on the recording layer would cause an additional property variation of the recording layer, such as its magnetic moment variation, MR ratio variation and high wafer non-uniformity. Therefore, it is desired to develop new technologies to greatly enhance interfacial perpendicular magnetic anisotropy while keeping a high MR ratio and good/uniform properties.

SUMMARY OF THE PRESENT INVENTION

The present invention comprises perpendicular magnetoresistive elements and methods of manufacturing such perpendicular magnetoresistive elements for perpendicular STT-MRAM devices as well as perpendicular SOT-MRAM devices. The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

In this invention, the perpendicular magnetoresistive element comprises: a reference layer having a magnetic anisotropy in a direction perpendicular to a film surface and having an invariable magnetization direction; a tunnel barrier layer on the reference layer; a recording layer having magnetic anisotropy in a direction perpendicular to a film surface and having a variable magnetization direction on the tunnel barrier layer and having a first free layer (FL1) with a bcc (100) texture, a second free layer (FL2) with a bcc (110) texture or a FCC (111) texture, and a crystal-breaking layer positioned between them; an iPMA cap layer on a surface of the recording layer. Typically, the tunnel barrier layer is made of a rocksalt crystal oxide such as MgO, both FL1 and FL2 are made of amorphous CoFeB. Magnetizations of FL1 and FL2 are strongly parallel-coupled across a thin crystal-breaking layer and rotate or switch as a whole. The iPMA cap layer comprises a bi-layer structure: one iPMA contacting sub-layer (iPMA-cSL), which is immediately adjacent to the FL2, and one iPMA metal sub-layer (iPMA-mSL), wherein the iPMA-mSL comprises a close-packed crystal structure: a face-centered cubic (FCC) crystal structure having a (111) plane parallel to the film surface or a hexagonal close-packed (HCP) crystal structure having a (0001) plane parallel to the film surface, and the iPMA-cSL has a critical thickness range and comprises a rocksalt or a simple crystal structure having a (111) plane parallel to the film surface which has a good lattice constant matching with the close-packed plane of the iPMA-mSL. After a thermal annealing process, the FL1 and its underneath tunnel barrier layer form a bcc-CoFe (100)/rocksalt-crystal (100) interface texture, while the FL2 and its above iPMA cap layer form a rocksalt-crystal (111)/bcc-CoFe (110) interface texture or rocksalt-crystal (111)/FCC-CoFe (111) interface texture. The iPMA cap layer introduces giant interfacial magnetic anisotropy energies (G-iMAEs) on the top surface of the recording layer after a thermal annealing, giving rise to a giant interfacial perpendicular magnetic anisotropy (G-iPMA) of the recording layer due to the special rocksalt-crystal (111)/bcc-CoFe (110) texture or rocksalt-crystal (111)/FCC-CoFe (111) texture. A high-temperature physical vapor deposition is preferred for the tunnel barrier layer to introduce rocksalt-crystal (100) texture while a low temperature physical vapor deposition is preferred for the iPMA-cSL having an immediate contact with the close-packed crystal textured iPMA-mSL to introduce rocksalt-crystal (111) texture. The critical thickness range of the iPMA-cSL for achieving G-iPMA is a small range about 3 or 4 atomic layers thick, depending on its adjacent iPMA-mSL. Here and thereafter throughout this application, each element written in the left side of "/" is stacked above an element written in the right side thereof.

MgO has a stable rocksalt structure and can be used for the tunnel barrier layer. High-temperature physical vapor deposition of an MgO layer on an amorphous under-layer favors nucleation with a rocksalt-crystal (100) texture, but kinetic limitations result in nucleation with random orientation at room temperature. For a CoFeB FL1 sandwiched by a thick MgO tunnel barrier layer with a (100) texture and a crystal-breaking layer, during a thermal annealing process, a crystallization process occurs to form body-centered cubic (bcc) CoFe grains having an epitaxial growth with (100) plane parallel to the film surface of the MgO layer to generate both a vPMA as Boron elements migrate into the adjacent crystal-breaking layer, and an iPMA as a bcc-CoFe (100)/rocksalt-MgO (100) texture with an atomic arrangement of 4-fold symmetry occurs at the interface between the CoFeB layer and the MgO layer. In more detail, there is a 45° rotational epitaxy between the crystallized bcc CoFe (100) and the rocksalt (100) textured MgO layers. It was reported (see Article: Extended Abstracts of the 2007 International Conference on Solid State Devices and Materials, paper C-5-2 by K. Tsunekawa, etc.) that the epitaxial relationship of bcc-CoFe (100)/MgO (100) originates that CoFe crystallizes out from the interface with the (100)-textured MgO layer by solid-state nucleation and grain growth during high-temperature annealing.

Also in this invention, a thin MgO film having been in a certain thickness range can be used for the iPMA-cSL, a Ru film can be used for the iPMA-mSL as an example, to achieve a G-iPMA of the recording layer after a thermal annealing. A Ru film having a HCP (0001) texture helps to promote a rocksalt-MgO (111) texture in the thin iPMA-cSL. After a thermal annealing, it further induces a rocksalt-MgO (111)/bcc-CoFe (110) texture or rocksalt-MgO (111)/FCC-CoFe (111) texture at the interface between the iPMA-cSL and the CoFeB FL2, which is sufficiently thin, and leads to an ultra-high value of iPMA, i.e., a G-iPMA. The reason that the amorphous CoFeB FL2 crystallizes into a bcc-CoFe structure with mostly (110) orientation or a FCC-CoFe structure with (111) orientation is due to its close lattice match to the strongly textured Ru (0001)/MgO (111) with 3-fold symmetry. However, when the thickness of the MgO iPMA-cSL is getting larger than the critical range, it is more likely to form an MgO (100) texture near the interface between the MgO iPMA-cSL and the CoFeB FL2, and consequently the CoFeB FL2 crystallizes into a bcc-CoFe structure with mostly (100) orientation or a FCC-CoFe structure with (111) orientation, yielding a low iMAE. It's noted that crystallization of CoFeB into FCC-CoFe (111) or bcc-CoFe (110) texture would lead a low MR ratio if such a CoFeB layer is immediately adjacent to the MgO tunnel barrier layer, however, it doesn't matter for the CoFeB FL2 since it doesn't contribute to MR ratio. So it is important to choose an iPMA-cSL within the critical thickness range. Having a G-iPMA, the volume perpendicular magnetic anisotropy (vPMA) of the recoding layer becomes less important. Therefore, a thinner insertion layer can be used in a recording layer of an MTJ element having an iPMA cap layer to achieve a low damping constant and a reduced write current is also achieved.

In this invention, a high MR ratio comes from the interface between the tunnel barrier layer and the FL1 having a bcc-CoFe (100)/rocksalt-oxide (100) texture, and a G-iPMA comes from the interface between the FL2 and the iPMA-cSL having a rocksalt-oxide (111)/bcc-CoFe (110) texture or rocksalt-ooxide (111)/FCC-CoFe (111) texture. As a result, the FL1 has a low perpendicular magnetic anisotropy and a low damping constant, while the FL2 has a giant interfacial perpendicular magnetic anisotropy and a high damping constant. So it is desired to have a thick FL1 and a thin FL2 to achieve optimized properties for the recording layer. Further, the crystal-breaking sub-layer is preferred to have a strong (110) texture. Since as-deposited Mo layers typically exhibit strong (110) crystalline textures, together with the rocksalt-oxide (111) texture of the iPMA-cSL, the inserted Mo layer between the FL1 and FL2 has a positive effect on promoting a (110) crystalline texture for FL2. FL2 can be a thin layer of Co, Co-riched CoFe, or a bi-layer of Co/CoFeB, or Co-riched CoFe/CoFeB for achieving a good quality of FCC (111) texture. FL2 can be also a thin layer of Co for achieving a good quality of FCC (111) texture or HCP (0001) texture.

DETAILED DESCRIPTION OF THE INVENTION

In general, according to one embodiment, there is provided a magnetoresistive element comprising:

a reference layer having a perpendicular magnetic anisotropy and having an invariable magnetization direction;

a tunnel barrier layer provided on a surface of the reference layer and having a rocksalt crystal structure;

a recording layer provided on a surface of the tunnel barrier layer, which is opposite to the surface of the reference layer, and having a variable magnetization direction and a tri-layer structure: a second free layer (FL2)/a crystal-breaking layer/a first free layer (FL1), wherein the FL1 has a bcc (100) texture and the FL2 has a bcc (110) or FCC (111) texture or HCP (0001) texture;

an iPMA cap layer provided on a surface of the recording layer, which is opposite to the surface of the tunnel barrier layer, and having one iPMA contacting sub-layer (iPMA-cSL) on a surface of the recording layer and one iPMA metal sub-layer (iPMA-mSL), wherein the iPMA-cSL comprises a rocksalt crystal structure having a critical thickness and having a (111) plane parallel to the film surface and the iPMA-mSL comprises a face-centered cubic (FCC) crystal structure having a (111) plane parallel to the film surface or a hexagonal close-packed (HCP) crystal structure having a (0001) plane parallel to the film surface, yielding a giant interfacial perpendicular magnetic anisotropy (G-iPMA) of the recording layer after thermal annealing;

an optional buffer layer provided on a surface the iPMA cap layer, which is opposite to the surface of the recording layer;

and an upper-contact multilayer provided on the most top of above said layers.

Figure 1:
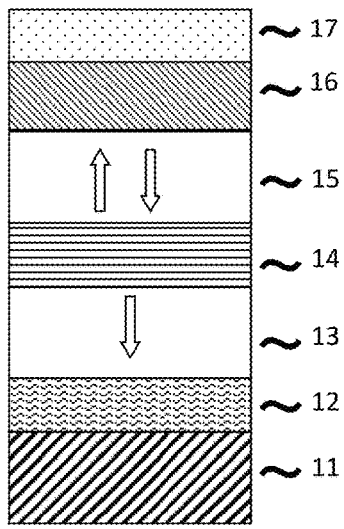
FIG. 1 is a cross-sectional view showing a schematic configuration of an MTJ element 1 as a prior art.

FIG. 1 is a cross-sectional view showing a configuration of an MTJ element 1 as a prior art. The MTJ element 1 is configured by stacking a bottom electrode 11, a seed layer 12, a reference layer 13, a tunnel barrier layer 14, a recording layer 15, a cap layer 16, and a protective layer 17 in this order from the bottom. The reference layer 13 and the recording layer 15 are made of ferromagnetic materials, and have uniaxial magnetic anisotropies in a direction perpendicular to the film surface. In another word, easy magnetization directions of the reference layer 13 and the recording layer 15 are perpendicular to the film surface. An easy magnetization direction is a direction in which the internal magnetic energy is at its minimum where no external magnetic field exists. Meanwhile, a hard magnetization direction is a direction which the internal energy is at its maximum where no external magnetic field exists.

The tunnel barrier layer 14 is made of a non-magnetic insulating metal oxide or nitride. The tri-layered structure consisting of the layers 13, 14 and 15 forms a magnetic tunneling junction (MTJ). The recording layer 15 has a variable (reversible) magnetization direction, while the reference layer 13 has an invariable (fixed) magnetization direction. The reference layer 13 is made of a ferromagnetic material having a perpendicular magnetic anisotropic energy which is sufficiently greater than that of the recording layer 14. This strong perpendicular magnetic anisotropy can be achieved by selecting a material, configuration and a film thickness. The perpendicular resistance of the MTJ is high when the magnetizations between the recording layer 15 and the reference layer 13 are anti-parallel; and the perpendicular resistance of the MTJ is low when the magnetizations between the recording layer 15 and the reference layer 13 are parallel. Also in this manner, a spin polarized current may only reverse the magnetization direction of the recording layer 15 while the magnetization direction of the reference layer 13 remains unchanged.

The cap layer 16 is a metal oxide layer or a transition metal layer having a body-centered cubic (bcc) crystalline structure, such as Ta, Hf and W. The cap layer 16 serves to introduce an interfacial perpendicular magnetic anisotropy of the recording layer 15. As an amorphous ferromagnetic material, CoFeB, in the recording layer is thermally annealed, a crystallization process occurs to form bcc CoFe grains having epitaxial growth with (100) plane parallel to surface of the tunnel barrier layer and a volume perpendicular magnetic anisotropy is induced in the recording layer, as Boron atoms migrate away toward the cap layer or any metal insertion layer in the middle of the recording layer. The (100) texture extends across the whole stack from the tunnel barrier layer to the cap layer. A further nonmagnetic metal layer (not shown here) inserted in the recording layer serves as a good absorber for Boron atoms to achieve better growth of CoFe crystal grains or a lower saturation magnetization moment.

First Embodiment of Current Invention

Figure 2:
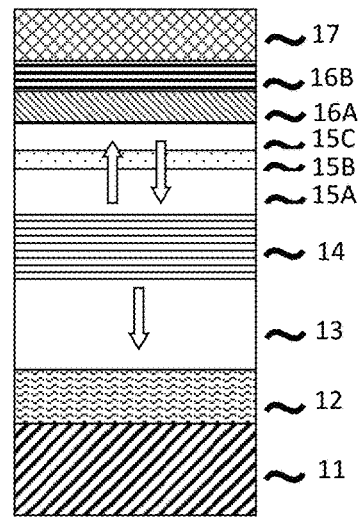
FIG. 2 is a cross-sectional view showing a schematic configuration of an MTJ element 10, according to the first embodiment.

FIG. 2 is a cross-sectional view showing a configuration of an MTJ element 10 as deposited according to the first embodiment in this invention. The MTJ element 10 is configured by stacking a bottom electrode 11, a seed layer 12, a reference layer 13, a tunnel barrier layer 14, a recording layer comprising a first free layer (FL1) 15A, a crystal-breaking layer 15B and a second free layer (FL2) 15C, an iPMA cap layer comprising an iPMA-cSL 16A and an iPMA-mSL 16B, and an upper-contact layer 17 in the order from the bottom to the top.

The reference layer, FL1 and FL2 are made of ferromagnetic materials. Magnetizations of FL1 and FL2 are strongly parallel-coupled across the thin crystal-breaking layer 15B such that they behave like magnetization of a single layer. Further, easy magnetization directions of the reference layer and the recording layer are perpendicular to the film surface. The tunnel barrier layer is made of a non-magnetic insulating metal oxide or nitride. The recording layer has a variable (reversible) magnetization direction. The reference layer has an invariable (fixing) magnetization direction. The reference layer is made of a ferromagnetic material having a perpendicular magnetic anisotropic energy which is sufficiently greater than the recording layer. In this manner, a spin polarized current may only reverse the magnetization direction of the recording layer while the magnetization direction of the reference layer remains unchanged.

Figure 3:
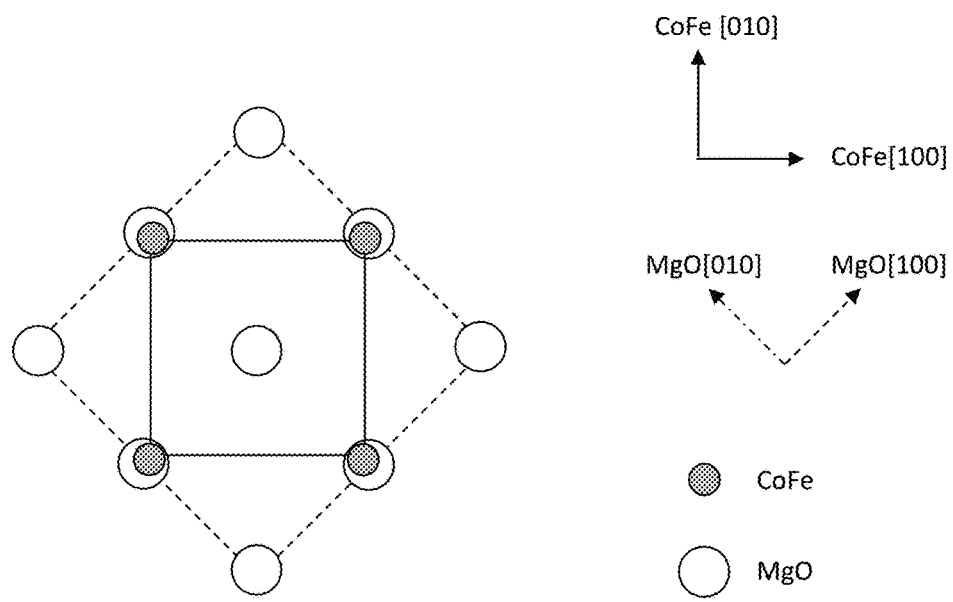
FIG. 3 is a schematic planar view of a bcc-CoFe (100)/MgO (100) texture at the interface of the first CoFeB free layer and the MgO tunnel barrier layer.

The tunnel barrier layer 14 is normally made of MgO and FL1 is made of CoFeB. The crystal-breaking layer 15B is typically selected from the group of Al, Mo, W, Hf and Ta, etc. Preferably the MgO tunnel barrier layer is deposited on a heated substrate in order to achieve a good MgO (100) texture. When a thermal annealing process is applied after the MTJ stack deposition, a crystallization process of the CoFeB FL1 layer occurs to form body-centered cubic (bcc) CoFe grains having an epitaxial growth with (100) plane parallel to the film surface of the MgO layer as Boron elements migrate into the adjacent crystal-breaking layer, i.e., a bcc-CoFe (100)/MgO (100) texture with an atomic arrangement of 4-fold symmetry occurs at the interface between the CoFeB FL1 and the MgO tunnel barrier layer, as shown in FIG. 3. This crystal texture is essential for achieving a high MR ratio.

Figure 4:
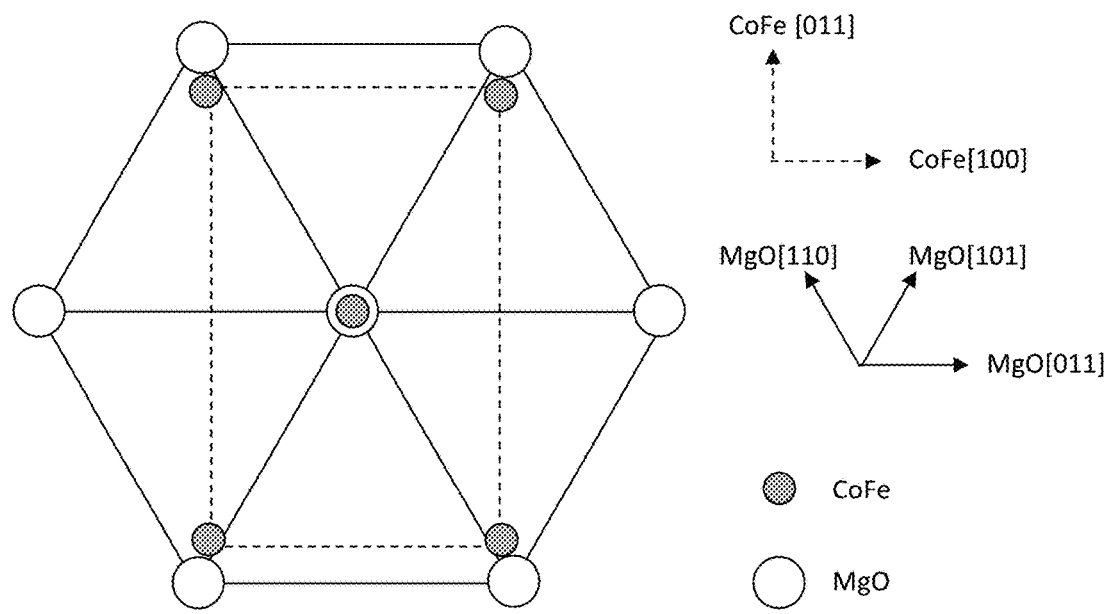
FIG. 4 is a schematic planar view of an MgO (111)/bcc-CoFe (110) texture at the interface of the second CoFeB free layer and the MgO iPMA-cSL.

The iPMA cap layer consists of one iPMA-cSL 16A and one iPMA-mSL 16B, wherein the iPMA-cSL comprises a rocksalt crystal structure having a (111) plane parallel to the film surface and the iPMA-mSL 16B comprises a face-centered cubic (FCC) crystal structure having a (111) plane parallel to the film surface or a hexagonal close-packed (HCP) crystal structure having a (0001) plane parallel to the film surface. For an example, the layer 16A is made of MgO and the layer 16B is made of Ru. The FL2 layer 15C is typically selected from the group of Co, CoFe, CoFeB, CoB, and CoFeMoB, etc. Preferably, the MgO iPMA-cSL 16A is deposited on a cold substrate in order to achieve initial random texture orientations. After a thermally annealing process, a re-crystallization process occurs for the MgO iPMA-cSL 16A to form MgO (111) by 3-fold symmetry matching to the iPMA-mSL crystal lattice and further a crystallization process occurs for the CoFeB FL2 layer to form body-centered cubic (bcc) CoFe grains having an epitaxial growth with (110) plane parallel to the film surface as Boron elements migrate into the adjacent crystal-breaking layer. As a result, an MgO (111)/bcc-CoFe (110) texture is formed at the interface between the CoFeB FL2 layer and the MgO iPMA-cSL, as shown in FIG. 4. This crystal texture is essential for achieving a giant interfacial perpendicular magnetic anisotropy of the FL2 layer, or effectively a G-iPMA of the recording layer. For a different iPMA-mSL 16B, the iPMA-cSL 16A has a certain thickness range to introduce a G-iPMA of the recording layer. For an example, if the layer 16A is made of MgO and the layer 15B is made of Ru, the thickness of the layer 16A shall be in the range 6+/−0.5 angstroms in order to achieve a G-iPMA of the recording layer.

An example configuration for the MTJ element 10 is described as follows. The reference layer 13 is made of CoFeB(around 1 nm)/W(around 0.2 nm)/Ru(around 0.5 nm)/Co(0.5 nm)/[Pt/Co]$_3$/Pt. The tunnel barrier layer 14 is made of MgO (around 1 nm). The recording layer is made of CoFeB(around 0.6 nm)/W(0.2 nm)/CoFeB(around 1.55 nm). The iPMA-cSL layer 16A is made of MgO (around 0.6 nm). The iPMA-mSL layer 16B is made of Ru (around 3 nm). The upper-contact layer 17 is made of Ta(around 25 nm)/Ru(around 2 nm)/W(around 1 nm). The seed layer 12 is made of Ta(around 20 nm)/Ru(around 20 nm)/Ta(around 20 nm).

Figure 5:
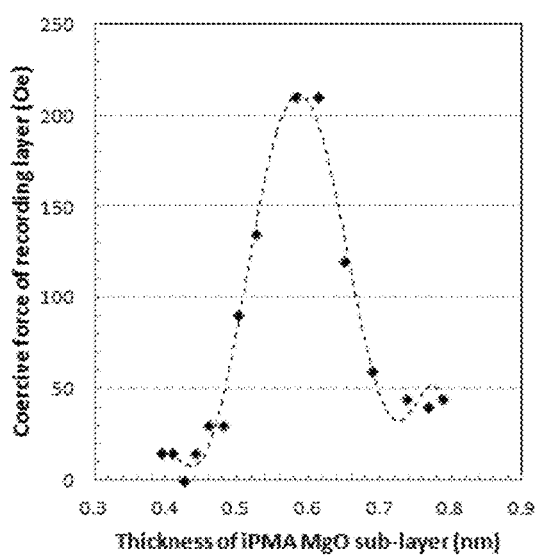
FIG. 5 is a set of experimental data showing the coercive force of the recording layer having an iPMA cap layer structure MgO(t)/Ru(3 nm) as a function of the iPMA-cSL thickness, t, in the first embodiment.

In the first example of un-patterned MTJ film study with an iPMA cap layer structure in which the recording layer is fixed to be CoFeB(0.6 nm)/W(0.2 nm)/CoFeB (1.55 nm) and the layer 16B is fixed to be Ru(3 nm), the MgO layer 16A thickness is varied from 0.4 nm to 0.8 nm in order to evaluate its impact on coercive force (Hc) of the recording layer. The Ru layer 16B is deposited using optimized PVD processing conditions in order to achieve a high quality HCP (0001) texture. As shown in FIG. 5, the magnetic conceive force (Hc) of the recording layer reaches its peak value of 210 Oe when the MgO layer 16A thickness is around 0.57 nm and becomes flat around 30 Oe when the MgO layer 16A thickness is more than 0.7 nm. The measurement at an elevated temperature 150-degree C. shows this coupon film sample has an effective perpendicular magnetic anisotropy field, Hk-eff, around 7,200 Oe, which satisfies automobile applications. It is also found that the magnitude of Hc of the recording layer depends upon both the film texture quality and the thickness of the layer 16B. For an example, as the physical vapor deposition (PVD) condition is intentionally adjusted to decrease the surface atom mobility during the Ru layer 16B deposition and make the film structure deviate from HCP (0001) texture, the peak value of Hc sharply decreases from 210 Oe to about 30 Oe when the MgO layer 16A thickness keeps unchanged around 0.57 nm. By further engineering the iPMA cap layer, the coercive force of an un-patterned recording layer can readily reach more than 350 Oe.

Figure 6:
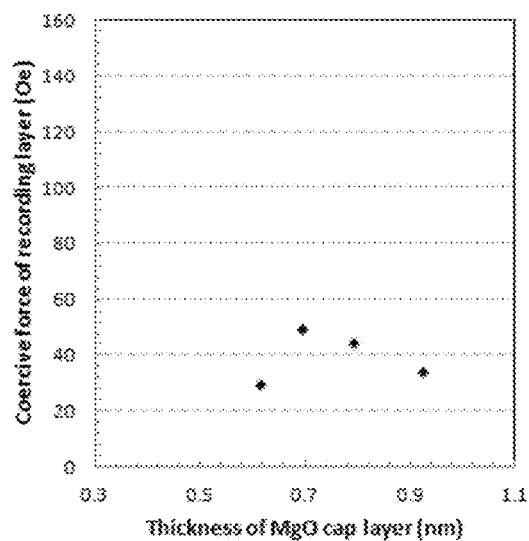
FIG. 6 is a set of experimental data showing the coercive force of the recording layer as a function of its MgO cap layer thickness in a prior art.

In the second example of un-patterned MTJ film study having an iPMA cap layer in which the recording layer 15 is fixed to be the same as previous two examples, i.e., CoFeB(0.6 nm)/W(0.2 nm)/CoFeB(1.55 nm) and the layer 16B is fixed to be Cu(0.5 nm)/Pt(1.2 nm), the MgO layer 16A thickness is varied from 0.4 nm to 1.0 nm in order to evaluate its impact on coercive force (Hc) of the recording layer. As shown in FIG. 6, the Hc of the recording layer reaches its peak value of 130 Oe when the MgO layer 16A thickness is around 0.75 nm and quickly drops to 30 Oe when the MgO layer 16A thickness is more than 0.9 nm. It is noted that the optimum thickness of MgO layer 16A in this case is different from those in the first and second examples.

In the above examples of un-patterned MTJ film studies with various iPMA cap layer structures, the Hc behavior of the recording layer is related to the crystalline structure of the iPMA cap layer, i.e., FCC (111)/rocksalt-MgO (111) or HCP (0001)/rocksalt-MgO (111) texture. Further, the whole texture structure from the iPMA cap layer to the MgO tunnel barrier layer is {HCP(0001) or FCC(111)}/rocksalt-MgO (111)/bcc-CoFe(110)/W-boride/bcc-CoFe(100)/rocksalt-MgO(100), which provides both a high MR-ratio and a giant perpendicular magnetic anisotropy.

For the prior art as shown in FIG. 1, the protective layer is fixed as Ta(25 nm)/Ru(2 nm)/W(1 nm)/Fe(0.3) and the thickness of the MgO cap layer is varied in order to study the PMA of the recording layer, CoFeB(0.6 nm)/W(0.2 nm)/CoFeB(1.55 nm). As shown in FIG. 6, it is found that the Hc of the recording layer remains low (around 40 Oe) in most of the thickness range of the MgO cap layer. It is believed that, in the prior art, the protective layer having a bcc phase material at its interface with its underneath MgO cap layer would help the MgO cap layer form a texture of (100) which further yields a rocksalt-MgO (100)/bcc-CoFe (100) texture at the interface between the MgO cap layer and the second CoFeB sub-layer in the recording layer after thermal annealing. Being different from the present invention, the texture structure from the MgO cap layer to the MgO tunnel barrier layer in the prior art is rocksalt-MgO (100)/bcc-CoFe (100)/ W-boride/bcc-CoFe (100)/rocksalt-MgO (100). Such a rocksalt-MgO (100)/bcc-CoFe (100) texture in the prior art generates a much smaller interfacial perpendicular magnetic anisotropy of the recording layer than the rocksalt-MgO (111)/bcc-CoFe (110) texture in an MTJ element having a iPMA cap layer in the present invention. The G-iPMA may come from a larger CoFe lattice distortion caused by the rocksalt-MgO (111)/bcc-CoFe (110) texture. A structured carbon-like lattice structure such as cubic Boron nitride may have a similar effect due to its hardness and strong bonding.

Second Embodiment of Current Invention

Figures 7, 8, 9:
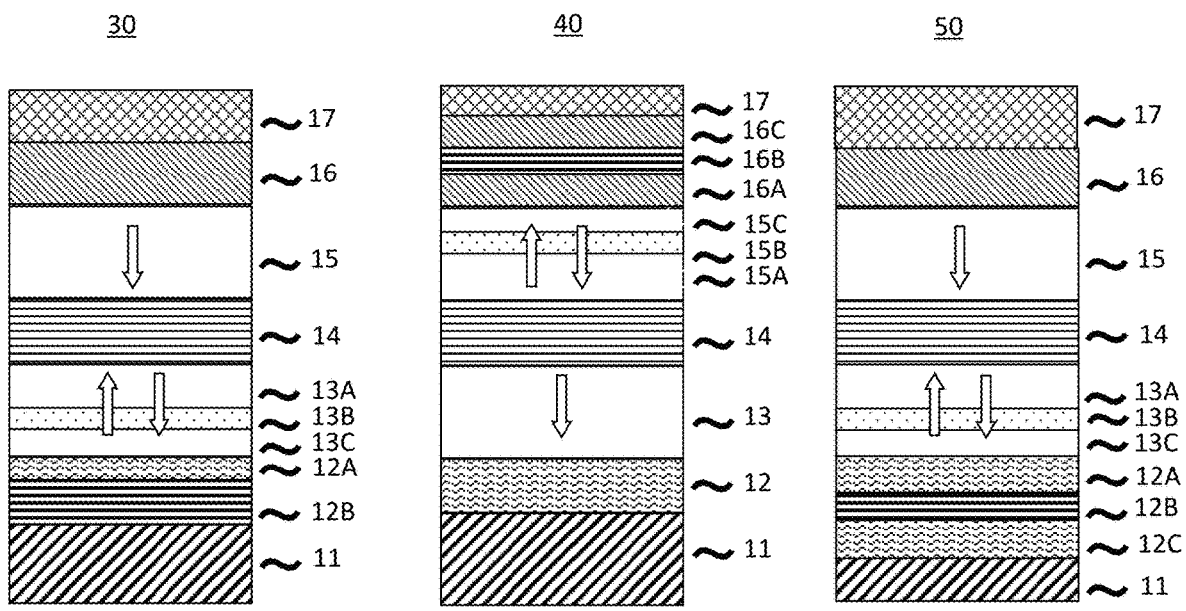
FIG. 7 is a cross-sectional view showing a configuration of an MTJ element 30 as deposited, according to the second embodiment.
FIG. 8 is a cross-sectional view showing a configuration of an MTJ element 40 as deposited, according to the third embodiment.
FIG. 9 is a cross-sectional view showing a configuration of an MTJ element 50 as deposited, according to the fourth embodiment.

FIG. 7 is a cross-sectional view showing an example configuration of the spin-orbit MTJ element 30 as deposited according to the second embodiment. The reference layer 15 is made of Pt/[Co/Pt]n/Co(around 0.5 nm)/Ru(around 0.4-5 nm)/W(around 0.15 nm)/CoFeB(around 1 nm). The tunnel barrier layer 14 is made of MgO(around 1 nm). The recording layer comprises a first free layer (FL1) 13A, a crystal-breaking layer 13B and a second free layer (FL2) 13C, and is made of CoFeB(around 1.2 nm)/W(around 0.2 nm)/ CoFeB(around 0.6 nm). The iPMA-cSL 12A is made of MgO (around 0.6 nm). The iPMA-mSL 12B is made of Pt. The upper-contact layer 17 is made of Ta (around 10 nm)/Ir (around 1 nm). The spin-orbit coupling layer 11 is made of Ta-doped Au (around 3 nm).

The reference layer 15 is made of a ferromagnetic material having a perpendicular magnetic anisotropic energy which is sufficiently greater than the recording layer. This strong perpendicular magnetic anisotropy can be achieved by selecting a material, configuration and a film thickness. A spin-orbit current flowing along spin-orbit coupling layer 11 may reverse the magnetization direction of the recording layer while the magnetization direction of the reference layer 15 remains unchanged. An MTJ element 30 which comprises a recording layer having a variable magnetization direction and a reference layer 15 having an invariable magnetization direction for a predetermined write current can be achieved.

The iPMA cap layer consists of one iPMA-cSL 12A and one iPMA-mSL 12B, wherein the iPMA contacting layer comprises a rocksalt crystal structure having a (111) plane parallel to the film surface and the iPMA-mSL comprises a face-centered cubic (FCC) crystal structure having a (111) plane parallel to the film surface or a hexagonal close-packed (HCP) crystal structure having a (0001) plane parallel to the film surface, yielding a giant interfacial magnetic anisotropy of the recording layer after thermal annealing. For various iPMA-mSL 12B, the iPMA-cSL 12A has a certain thickness range to introduce a G-iPMA of the recording layer.

Third Embodiment of Current Invention

FIG. 8 is a cross-sectional view showing a configuration of an MTJ element 40 as deposited according to the third embodiment. The MTJ element 40 is configured by stacking a bottom electrode 11, a seed layer 12, a reference layer 13, a tunnel barrier layer 14, a recording layer comprising a first free layer (FL1) 15A, a crystal-breaking layer 15B and a second free layer (FL2) 15C, an iPMA-cSL 16A, an iPMA-mSL 16B, a buffer layer 16C and an upper-contact layer 17 in this order from the bottom.

The iPMA cap layer consists of one iPMA-cSL 16A and one iPMA-mSL 16B, wherein the iPMA-cSL comprise a rocksalt crystal structure having a (111) plane parallel to the film surface and the iPMA-mSL comprises a face-centered cubic (FCC) crystal structure having a (111) plane parallel to the film surface or a hexagonal close-packed (HCP) crystal structure having a (0001) plane parallel to the film surface, yielding a G-iPMA of the recording layer after thermal annealing. For various transition iPMA-mSL 16B, the iPMA-cSL 16A has a certain thickness range to introduce a giant iPMA of the recording layer 15. Since the upper-contact layer may affect the crystal structure of the iPMA metal layer through diffusion or crystalline phase mismatch, the buffer layer 16C is employed to separate the iPMA metal layer and the upper-contact layer. Typically, the material choice of the buffer layer 16C is an oxide or amorphous layer.

Fourth Embodiment of Current Invention

Similar to above embodiments, the same principle can be adopted in a reverse-structured MTJ element 50, as shown in FIG. 9. The MTJ element 50 is configured as follows. The reference layer 15 is made of Pt/[Co/Pt]n/Co(around 0.5 nm)/Ru(around 0.4-5 nm)/W(around 0.15 nm)/CoFeB (around 1 nm). The tunnel barrier layer 14 is made of MgO (around 1 nm). The recording layer comprises a first free layer (FL1) 13A, a crystal-breaking layer 13B and a second free layer (FL2) 13C, and is made of CoFeB(around 1.2 nm)/W(around 0.2 nm)/CoFeB(around 0.6 nm). The first iPMA-cSL 12A is made of MgO (around 0.6 nm). The iPMA-mSL 12B is made of Ru or NiFe(around 5 nm)/Ru (around 3 nm). The buffer layer 12C is made of Al2O3 or MgO (around 0.6 nm). The upper-contact layer 17 is made of Ta/Ir (around 10 nm). The seed layer 11 is made of Ta(around 20 nm)/Ru(around 20 nm)/Ta(around 20 nm).

In an example of un-patterned MTJ film study with an iPMA cap layer structure of the fourth embodiment in which the iPMA-cSL 16A is fixed to be the previous optimized MgO (0.61 nm), the iPMA-mSL 16B is fixed to be Ru (2 nm), the buffer layer 16C is an MgO layer with a thickness varied from 0.4 nm to 0.92 nm in order to evaluate its impact on coercive force (Hc) of the recording layer. The Hc of the recording layer reaches its peak value of 375 Oe when the MgO buffer layer 16C thickness is around 0.6 nm.

Fifth Embodiment of Current Invention

Figure 10:
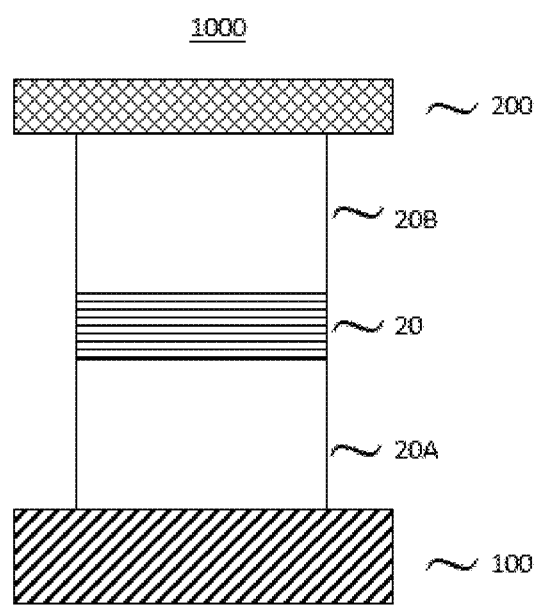
FIG. 10 is a cross-sectional view showing a configuration of an MTJ element 100 as deposited, according to the fifth embodiment.

The temperature dependence of the effective perpendicular magnetic anisotropy field, Hk-eff, of the recording layer is very critical for an MRAM device in an automobile application. A high temperature study has been conducted on the sample having the peak Hc value in the first example of un-patterned MTJ film study. It is found that the Hk-eff at room temperature is as high as 16 kOe at room temperature, while it rapidly decreases to ~3 kOe at 200 degrees Celsius. It suggests that for a pure spin-transfer current writing, it is very difficult at room temperature due to the ultra-high Hk-eff, but it becomes much easier at 200 degrees Celsius. FIG. 10 is a cross-sectional view showing a configuration of a memory cell 1000 as deposited according to the fifth embodiment. In this memory cell, the MTJ junction 20 can be chosen as anyone from previous three embodiments. Although the MTJ junction with a few thousand ohms resistance is a heating source when a writing current is applied, the upper-contact multilayer of the MTJ element may comprise an additional heating sub-layer (not shown here). Both the thermal barrier layer 20B and the upper portion of the bottom electrode 20A have thermal conductivities smaller than 20 watts per meter-kelvin such that during a writing process the electrical writing current generates a heat to warm up the MTJ element to an elevated temperature in which the Hk-eff of the recording layer is greatly reduced and the writing process can be successful. Further, this structure (20A/20/20B) is sandwiched by a top electrode 100 and a bottom electrode 200. Typically, TiN has a low thermal conductivity of 11.9 watts per meter-kelvin and TiAlN (at the Al/Ti atomic ratio around 0.72) has an even lower thermal conductivity of 4.6 watts per meter-kelvin. A multilayer structure [TiN/TiAlN]. can be also designed to achieve a thermal conductivity between 3 and 5 watts per meter-kelvin. In the same time, the fixed magnetization of the reference layer should be kept stable at an elevated temperature. So it is desired that the temperature at the interface between the iPMA-cSL and the recording layer is higher than that of the reference layer by specially designing the thermal barrier layer 20B and the layer 20A with proper materials and thicknesses. Ge2Sb2Te5 has been widely used as phase-change material due to its ultralow thermal conductivity. It is reported (see Article: APPLIED PHYSICS LETTERS 89, 151904, 2006, by H. Lyeo, etc.) that after performing a thermal annealing at 400-degree Celsius, a Ge2Sb2Te5 layer has a stable HCP phase with a thermal conductivity of 1.1 watts per meter-kelvin and an electrical conductivity of ~590 micro-ohm-cm. A layer of GeSbTe is also a good candidate for the thermal barrier in this embodiment.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a reference layer having a magnetic anisotropy in a direction perpendicular to a film surface and having an invariable magnetization direction;
a tunnel barrier layer provided on a surface of the reference layer and having a rocksalt crystal structure with a (100) texture;
a recording layer provided on a surface of the tunnel barrier layer, which is opposite to a surface of the tunnel barrier layer where the reference layer is provided, and having a magnetic anisotropy in a direction perpendicular to a film surface and having a variable magnetization direction, and comprising a first free layer in immediate contact with the tunnel barrier layer and having a body-centered cubic structure with a (100) texture, and a second free layer having a body-centered cubic structure with a (110) texture or a face-centered cubic structure with a (111) texture or a hexagonal close-packed (HCP) crystal structure with a (0001) texture, and a crystal-breaking layer sandwiched between the first free layer and the second free layer;
an iPMA cap layer provided on a surface of the recording layer, which is opposite to the surface of the recording layer where the tunnel barrier layer is provided, and comprising an iPMA contacting sub-layer (iPMA-cSL) in immediate contact with the second free layer of the recording layer and an iPMA metal sub-layer (iPMA-mSL), wherein the iPMA-mSL comprises a face-centered cubic (FCC) structure with a (111) texture or a hexagonal close-packed (HCP) structure with a (0001) texture, and the iPMA-cSL comprises a rocksalt crystal structure with a (111) texture or a crystal structure with a texture having a atomic arrangement of 3-fold symmetry or 6-fold symmetry and has a critical thickness, yielding a giant interfacial perpendicular magnetic anisotropy (G-iPMA) of the recording layer after a thermal annealing;
and an upper-contact multilayer provided on the most top of above said layers.

2. The element of claim 1, wherein the iPMA-cSL consists of one of MgO, ZnO, MgZnO, ZrO, MgZrO, MgAlO, TaO, Al2O3, SiO2, SiC, TaC, TiC, WC, diamond-like Carbon (DLC), cubic Boron nitride (CBN).

3. The element of claim 1, wherein the critical thickness of the iPMA-cSL is chosen to be in the range which gives at least 75% of the peak value of the G-iPMA of the recording layer.

4. The element of claim 1, wherein the iPMA-mSL includes at least one of Ru, Rh, Rd, Ni, Cu, Zn, Ag, Os, Ir, Pt, Zn, Cd, and alloys thereof, NiFe, NiFeCr, NiCr, NiMn, NiMnCr, IrMn, PtMn.

5. The element of claim 1, wherein the first free layer includes at least one ferromagnetic Boron alloy layer, preferred to be one of CoFeB, CoB and FeB, the B composition percentage is between 10%-35%.

6. The element of claim 1, wherein the crystal-breaking layer includes at least one element selected from the group of Al, Mo, W, Ta, Hf, Nb, Zr, Mg.

7. The element of claim 1, wherein the second free layer includes at least one Co-based layer, preferred to be one of CoFeB, CoB and Co.

8. A magnetic random memory comprises a memory cell which comprises the magnetoresistive element according to the claim 1.

9. A method of manufacturing a magnetoresistive element for being used in a magnetic memory device comprising:
providing a substrate;
forming a bottom contact layer on the substrate;
forming a reference layer having a magnetic anisotropy in a direction perpendicular to a film surface and having an invariable magnetization direction atop the bottom contact layer;
forming a tunnel barrier layer atop the reference layer;
forming a recording layer comprising forming a first free layer atop the tunnel barrier layer, forming a crystal-breaking layer atop the first free layer and forming a second free layer containing Co atoms atop the crystal-breaking layer, and having a giant interfacial perpendicular magnetic anisotropy (G-iPMA) and having a variable magnetization direction;
forming an iPMA contact sub-layer (iPMA-cSL) atop the recording layer;
forming an iPMA metal sub-layer (iPMA-mSL) having a face-centered cubic (FCC) crystal structure or a hexagonal close-packed (HCP) crystal structure atop the iPMA-cSL;
forming an upper-contact multilayer atop the iPMA-mSL;
and performing a thermal annealing at an elevated temperature of at least 250-degree C.;
wherein after the thermal annealing process, the tunnel barrier layer has a rocksalt crystal structure with a (100) texture, the first free layer has a body-centered cubic structure with a (100) texture, the second free layer has a body-centered cubic structure with a (110) texture or a face-centered cubic structure with a (111) texture or a hexagonal close-packed (HCP) crystal structure with a (0001) texture, the iPMA-cSL has a rocksalt crystal structure with a (111) texture or a crystal structure with a texture having a atomic arrangement of 3-fold symmetry or 6-fold symmetry.

10. The element of claim 9, wherein the iPMA-cSL consists of one of MgO, ZnO, MgZnO, ZrO, MgZrO, MgAlO, TaO, Al2O3, SiO2, SiC, TaC, TiC, WC, diamond-like Carbon (DLC), cubic Boron nitride (CBN), and has a thickness in a critical range which gives at least 75% of the peak value of the G-iPMA of the recording layer.

11. The element of claim 9 further comprising performing a substrate cooling process between forming the recording layer and forming the iPMA-cSL.

12. The element of claim 9, wherein the iPMA-mSL includes at least one of Ru, Rh, Rd, Ni, Cu, Zn, Ag, Os, Ir, Pt, Zn, Cd, and alloys thereof, NiFe, NiFeCr, NiCr, NiMn, NiMnCr, IrMn, PtMn.

13. The element of claim 9, wherein the first free layer includes at least one ferromagnetic Boron alloy layer, preferred to be one of CoFeB, CoB and FeB, the B composition percentage is between 10%-35%.

14. The element of claim 9, wherein the crystal-breaking layer includes at least one element selected from the group of Al, Mo, W, Ta, Hf, Nb, Zr, Mg.

15. A method of manufacturing a magnetoresistive element for being used in a spin-orbit magnetic memory device comprising:
providing a substrate;
forming a spin-orbit coupling layer on the substrate;
forming an iPMA metal sub-layer (iPMA-mSL) having a face-centered cubic (FCC) crystal structure or a hexagonal close-packed (HCP) crystal structure atop the spin-orbit coupling layer;
forming an iPMA contact sub-layer (iPMA-cSL) atop the iPMA-mSL;
forming a recording layer comprising forming a first free layer containing Co atoms atop the iPMA-cSL, forming a crystal-breaking layer atop the first free layer and forming a second free layer atop the crystal-breaking layer, and having a giant interfacial perpendicular magnetic anisotropy (G-iPMA) and having a variable magnetization direction;
forming a tunnel barrier layer atop the recording layer;
forming a reference layer having a magnetic anisotropy in a direction perpendicular to a film surface and having an invariable magnetization direction atop the tunnel barrier layer;
forming an upper-contact multilayer atop the reference layer;
and performing a thermal annealing at an elevated temperature of at least 250-degree C.;
wherein after the thermal annealing process, the tunnel barrier layer has a rocksalt crystal structure with a (100) texture, the second free layer has a body-centered cubic structure with a (100) texture, the first free layer has a body-centered cubic structure with a (110) texture or a face-centered cubic structure with a (111) texture or a hexagonal close-packed (HCP) crystal structure with a (0001) texture, the iPMA-cSL has a rocksalt crystal structure with a (111) texture or a crystal structure with a texture having a atomic arrangement of 3-fold symmetry or 6-fold symmetry.

16. The element of claim 15, wherein the iPMA-cSL consists of one of MgO, ZnO, MgZnO, ZrO, MgZrO, MgAlO, TaO, Al2O3, SiO2, SiC, TaC, TiC, WC, diamond-like Carbon (DLC), cubic Boron nitride (CBN), and has a thickness in a critical range which gives at least 75% of the peak value of the G-iPMA of the recording layer.

17. The element of claim 15 further comprising performing a substrate cooling process between forming the recording layer and forming the iPMA-cSL.

18. The element of claim 15, wherein the iPMA-mSL includes at least one of Ru, Rh, Rd, Ni, Cu, Zn, Ag, Os, Ir, Pt, Zn, Cd, and their alloy, NiFe, NiFeCr, NiCr, NiMn, NiMnCr, IrMn, PtMn.

19. The element of claim 15, wherein the second free layer includes at least one ferromagnetic Boron alloy layer, preferred to be one of CoFeB, CoB and FeB, the B composition percentage is between 10%-35%.

20. The element of claim 15, wherein the crystal-breaking layer includes at least one element selected from the group of Al, Mo, W, Ta, Hf, Nb, Zr, Mg.

* * * * *